US012671404B2

(12) United States Patent
Sandrez et al.

(10) Patent No.: US 12,671,404 B2
(45) Date of Patent: Jun. 30, 2026

(54) BOOTSTRAPPED SWITCHING CIRCUIT

(71) Applicant: NXP USA, INC., Austin, TX (US)

(72) Inventors: Pascal Sandrez, Toulouse (FR); Thomas Mallard, Toulouse (FR); An Vu Thuy Hoang, Toulouse (FR); Matthew Francis Bacchi, Saveres (FR); Thierry Dominique Yves Cassagnes, Tournefeuille (FR)

(73) Assignee: NXP USA, Inc., Austin, TX (US)

( * ) Notice: Subject to any disclaimer, the term of this patent is extended or adjusted under 35 U.S.C. 154(b) by 13 days.

(21) Appl. No.: 18/792,815

(22) Filed: Aug. 2, 2024

(65) Prior Publication Data

US 2025/0055450 A1     Feb. 13, 2025

(30) Foreign Application Priority Data

Aug. 9, 2023    (EP) .................................... 23306356

(51) Int. Cl.
H03K 17/06 (2006.01)
H03K 17/10 (2006.01)
(Continued)

(52) U.S. Cl.
CPC ......... H03K 17/063 (2013.01); H03K 17/102 (2013.01); H03K 19/018521 (2013.01); H01M 10/4264 (2013.01); H01M 2010/4271 (2013.01)

(58) Field of Classification Search
CPC ............... H03K 17/063; H03K 17/102; H03K 19/018521
See application file for complete search history.

(56) References Cited

U.S. PATENT DOCUMENTS 5,019,731 A     5/1991  Kobayashi
8,604,862 B2  12/2013  Birk et al.
(Continued)

FOREIGN PATENT DOCUMENTS

JP        2009069056 A  *  4/2009  .......... H01M 10/482

OTHER PUBLICATIONS

Kadirvel, K., "A Stackable, 6-Cell, Li-Ion, Battery Management IC for Electric Vehicles With 13, 12-bit ΣΔ ADCs, Cell Balancing, and Direct-Connect Current-Mode Communications", IEEE Journal of Solid-State Circuits, vol. 49, No. 4, Apr. 2014.

(Continued)

*Primary Examiner* — Daniel C Puentes

(57)     ABSTRACT

This disclosure relates to a bootstrapped switching circuit. Example embodiments include a bootstrapped switching circuit (100) comprising: a positive output node (109+); a negative output node (109−); a first input node (106a) configured to receive a first input voltage (Vin1); a second input node (106b) configured to receive a second input voltage (Vin2). First, second third and fourth switches (101-104) are coupled between the input and output nodes (106a, 106b, 109+, 109−). A first negative bootstrapped level shifter (107a) and a first positive bootstrapped level shifter (107b) coupled between the first input node (106a) and a first clock signal circuit (110a) provide control signals to the first and second switches (101, 102). A second negative bootstrapped level shifter (108a) and a second positive bootstrapped level shifter (108b) coupled between the second input node (106b) and a second ground referenced supply line (110b) provide control signals to the third and fourth switches (103, 104). Each of the first, second, third and fourth switches (101, 102, 103, 104) comprise first and second MOSFETs (201a, 201b, 202a, 202b, 203a, 203b, (Continued)

204a, 204b) of an opposite type in a series connected arrangement.

19 Claims, 16 Drawing Sheets

(51) Int. Cl.
  *H03K 19/0185* (2006.01)
  *H01M 10/42* (2006.01)

(56) References Cited

U.S. PATENT DOCUMENTS

| | | | |
|---|---|---|---|
| 8,963,630 | B2 | 2/2015 | Ceballos et al. |
| 9,287,862 | B2 | 3/2016 | Viswanath et al. |
| 9,641,166 | B2 | 5/2017 | Devarajan et al. |
| 9,977,057 | B2 | 5/2018 | Guthrie et al. |
| 10,200,041 | B2 | 2/2019 | Gorbold et al. |
| 10,250,206 | B2 * | 4/2019 | Honda ..................... G01R 1/20 |
| 2017/0077803 | A1 | 3/2017 | Stulik |
| 2021/0116957 | A1 | 4/2021 | Imaizumi |

OTHER PUBLICATIONS

Man, X., "A High Precision Multi-Cell Battery Voltage Detecting Circuit for Battery Management Systems", 2016 IEEE 83rd Vehicular Technology Conference (VTC Spring), May 15-18, 2016.
Sun, Q., "A 12-Cell Battery Monitor IC with 2-Channel 16-bit ADCs and Isolated Bidirectional Data Interface", 2020 IEEE International Conference on Integrated Circuits, Technologies and Applications (ICTA), Nov. 23-25, 2020.

* cited by examiner

BOOTSTRAPPED SWITCHING CIRCUIT

CROSS-REFERENCE TO RELATED APPLICATIONS

This application claims the priority under 35 U.S.C. § 119 of European Patent application no. 23306356.9, filed on 9 Aug. 2023, the contents of which are incorporated by reference herein.

TECHNICAL FIELD

This disclosure relates to a bootstrapped switching circuit for use in an analog front end of data acquisition system such as a battery management system.

BACKGROUND

Battery management systems are used to monitor voltage and/or current, to protect a battery from overcharging, electrical overload, or causing overvoltage, therefore optimising battery performance, and are therefore required to measure voltages across individual cells in a battery.

It is often necessary for battery management systems to operate within a wide range of common mode voltages, the common mode voltage being dependent on the position of a cell within a battery stack. For example, batteries for an electric motor may comprise stacks of cells having common mode voltages ranging between a few volts up to 100V or more.

A battery management system analog front end (AFE) may use a differential analog multiplexer (AMUX) that operates in a wide range of common mode voltages to measure cell voltages up to 5V. Metal shunts may be connected to AFE inputs rather than the battery cells, requiring voltage across the shunt to also be measured. Using shunts leads to bipolar differential input signals (e.g., –2V to +5V). The AMUX at the input of the AFE may also be used as a chopper, which leads to high voltage differential outputs (e.g., –5V to +5V). In these conditions, leakages through switches of the AMUX cannot be allowed as they will cause errors in the input-to-output differential signal transfer and possible additional errors caused by undesired IR drops on resistors of an external anti-aliasing filter.

Traditionally, an approach to avoid leakages uses complementary T-switches in a high voltage AMUX, in which gates of the switches are controlled by voltages in a 0V to 5V range when referred to the lower of two input potentials. This method requires determining which of the two input potentials is lower. Detecting the lower of the two inputs may be determined using a circuit, but such a circuit will require many high voltage components that require increased space compared to low voltage components.

A method to overcome leakages without the need for determining the lower input signal of multiple input signals, and preferably using a minimum of high voltage rated components is therefore desired.

SUMMARY

According to a first aspect there is provided a bootstrapped switching circuit comprising:

a positive output node;

a negative output node;

a first input node configured to receive a first input voltage;

a second input node configured to receive a second input voltage;

a first switch coupled between the first input node and the positive output node; a second switch coupled between the first input node and the negative output node;

a third switch coupled between the second input node and the negative output node;

a fourth switch coupled between the second input node and the positive output node;

a first negative bootstrapped level shifter and a first positive bootstrapped level shifter, each coupled between the first input node and a first clock signal circuit and configured to provide control signals to the first and second switches;

a second negative bootstrapped level shifter and a second positive bootstrapped level shifter, each coupled between the second input node and a second clock signal circuit and configured to provide control signals to the third and fourth switches, wherein each of the first, second, third and fourth switches comprises first and second MOSFETs of an opposite type in a series connected arrangement.

The bootstrapped switching circuit may be for an analog front end of a data acquisition system such as a battery management system, in which the output nodes are sampled to measure voltages across the first and second input nodes. In a battery management system the first and second input nodes are connected across a cell of a battery.

Each of the bootstrapped level shifters may comprise:

a first level shifter MOSFET;

a second level shifter MOSFET;

a first level shifter capacitor connected between a drain of the first level shifter MOSFET and a first output of a respective clock signal circuit, the drain of the first level shifter MOSFET connected to a gate of the second level shifter MOSFET; and a second level shifter capacitor connected between a drain of the second level shifter MOSFET and a second output of a respective clock signal circuit, the drain of the second level shifter MOSFET connected to a gate of the first level shifter MOSFET.

The first and second clock signal circuits may each comprise:

a clock signal source;

a first inverter connected between the clock signal source and the first output; and a second inverter connected between the first inverter and the second output.

In some examples the first and second level shifter MOSFETs of the first and second negative bootstrapped level shifters are P-channel MOSFETs and the first and second level shifter MOSFETs of the first and second positive bootstrapped level shifters are N-channel MOSFETs In some examples of the switching circuit:

a source of the first MOSFET of the first and second switches is connected to the first input node;

a source of the second MOSFET of the first and second switches is connected to a drain of the first MOSFET of the first and second switches;

a drain of the second MOSFET of the first switch is connected to the positive output node; and a drain of the second MOSFET of the second switch is connected to the negative output node, wherein the first MOSFET of the first and second switches is an n-channel MOSFET and the second MOSFET of the first and second switches is a p-channel MOSFET.

In some examples of the switching circuit:
a drain of the first MOSFET of the third and fourth switches to the second input node;
a drain of the second MOSFET of the third and fourth switches is connected to a source of the first MOSFET of the third and fourth switches;
a source of the second MOSFET of the third switch is connected to the positive output node; and
a source of the second MOSFET of the fourth switch is connected to the negative output node,
wherein the first MOSFET of the third and fourth switches is a p-channel MOSFET and the second MOSFET of the third and fourth switches is an n-channel MOSFET.
In some examples of the switching circuit:
a gates of the first MOSFET of the first switch is connected to the drain of the first level shifter MOSFET of the first positive bootstrapped level shifter and a gate of the second MOSFET of the first switch is connected to the drain of the second level shifter MOSFET of the first negative bootstrapped level shifter;
a gate of the first MOSFETs of the second switch is connected to the drain of the second level shifter MOSFET of the first positive bootstrapped level shifter and a gate of the second MOSFET of the second switch is connected to the drain of the first level shifter MOSFET of the first negative bootstrapped level shifter;
a gate of the first MOSFET of the third switch is connected to the drain of the first level shifter MOSFET of the second positive bootstrapped level shifter and a gate of the second MOSFET of the third switch is connected to the drain of the second level shifter MOSFET of the second negative bootstrapped level shifter; and
a gate of the first MOSFET of the fourth switch is connected to the drain of the second level shifter MOSFET of the second positive bootstrapped level shifter and a gate of the second MOSFET of the fourth switch is connected to the drain of the first level shifter MOSFET of the second negative bootstrapped level shifter.
The switching circuit may be configured to operate in:
a first mode where the first and third switches are closed to connect the first input node to the positive output node and the second input node, to the negative output node, while the second and fourth switches are open; and
a second mode where the second and fourth switches are closed to connect the first input node to the negative output node and the second input node to the positive output node, while the first and third switches are open.
The switching circuit may further comprise a first tank capacitor circuit, the first tank capacitor circuit comprising first, second third and fourth tank diodes and first and second tank capacitors, the first tank capacitor connected between the first input node and a cathode terminal of the third and fourth tank diodes, the second tank capacitor connected between the first input node and an anode terminal of the first and second tank diodes.
Anode terminals of the first and second tank diodes of the first tank capacitor circuit may be connected to the first and second level shifter capacitors of the first positive bootstrapped level shifter. Cathode terminals of the third and fourth tank diodes of the first tank capacitor circuit may be connected to the first and second level shifter capacitors of the first negative bootstrapped level shifter.
The first and second tank diodes of the first tank capacitor circuit may be p-channel MOSFETs connected as p-n junction diodes and the third and fourth tank diodes of the first tank capacitor circuit n-channel MOSFETs connected as p-n junction diodes.
The switching circuit may further comprise a second tank capacitor circuit, the second tank capacitor circuit comprising first, second, third and fourth tank diodes and first and second tank capacitors, the first tank capacitor connected between the second input node and anode connections of the first and second tank diodes, the second tank capacitor connected between the second input node and cathode connections of the first and second tank diodes.
Anode connections of the first and second tank diodes of the second tank capacitor circuit may be connected to the first and second level shifter capacitors of the second positive bootstrapped level shifter. Cathode connections of the third and fourth tank diodes of the second tank capacitor circuit may be connected to the first level shifter capacitors of the second negative bootstrapped level shifter.
The first and second tank diodes of the second tank capacitor circuit may be p-channel MOSFETs connected as p-n junction diodes and the third and fourth tank diodes of the second tank capacitor circuit n-channel MOSFETs connected as p-n junction diodes.
Each switch of the switching circuit may further comprise:
a first switch inverter connected to the gate of the first MOSFET; and
a second switch inverter connected to the gate of the second MOSFET.
According to a second aspect there is provided a battery management system comprising an analog front end and a digital sampling module, the analog front end comprising a plurality of switching circuits according to the first aspect, the first and second input nodes of each switching circuit being connected to respective first and second output connections of each one of a respective plurality of cells of a battery, the digital sampling module connected to sample voltages across the positive and negative output nodes of each switching circuit in the analog front end. Other features associated with the first aspect may also apply to the battery management system of the second aspect.

BRIEF DESCRIPTION OF THE DRAWINGS

Embodiments will be described, by way of example only, with reference to the drawings, in which.

DETAILED DESCRIPTION

Figure 1:
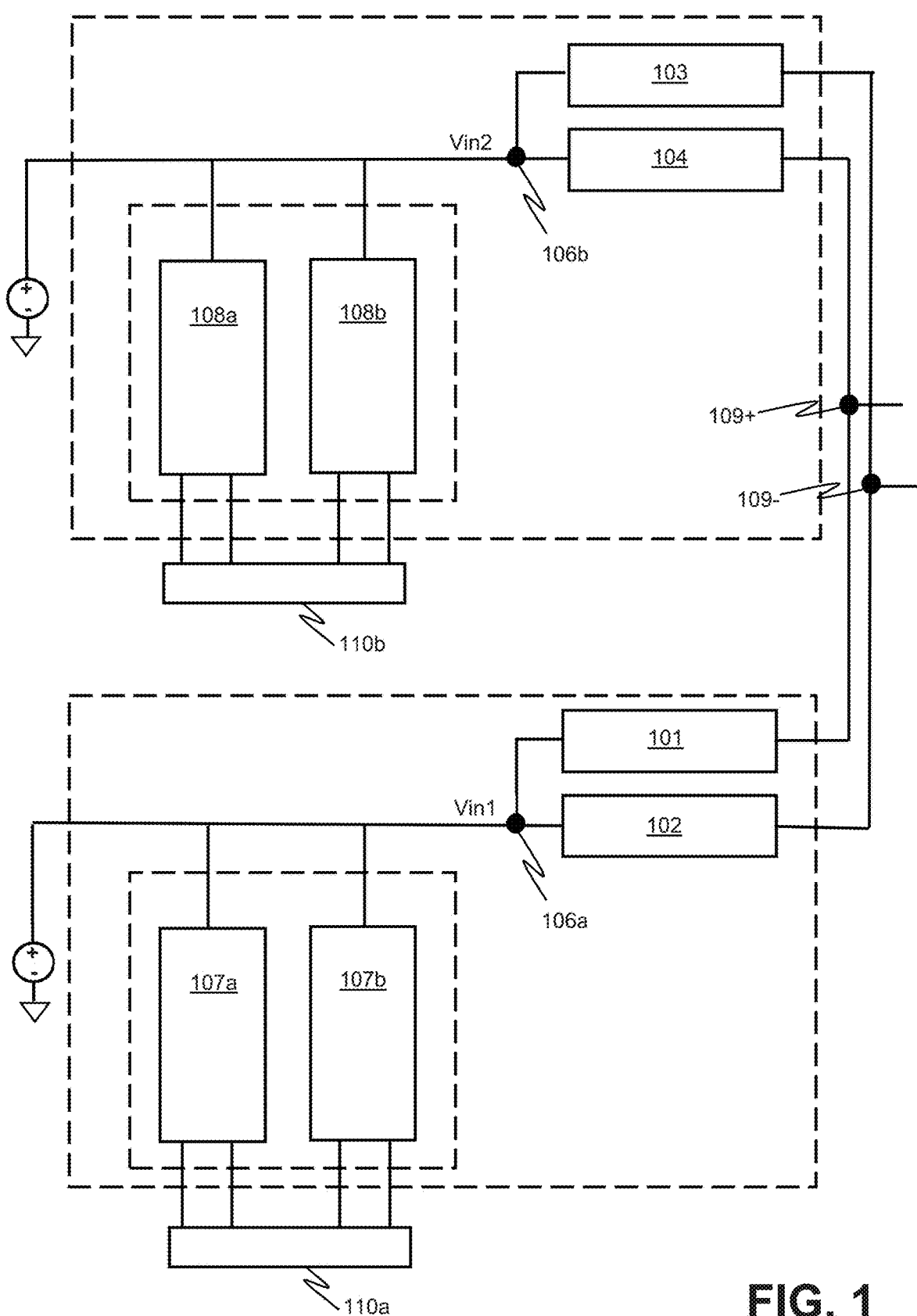
FIG. 1 is a block diagram illustrating a bootstrapped switching circuit for an analog front end of a battery management system.

FIG. 1 illustrates an example switching circuit 100 for use in an analog front end of a battery management system (BMS) for battery cell voltage measurements. The circuit 100 is configured to measure a differential voltage between two input voltages, where the lower of the two voltages may be unknown. In a battery management system, the differential voltage will correspond to the voltage across one cell or a shunt within a battery stack. The circuit 100 comprises a first input node 106a configured to receive a first input voltage Vin1, a second input node 106b configured to receive a second input voltage Vin2, a positive output node 109+, a negative output node 109−, a first switch 101 coupled between the first input node 106a and the positive output node 109+, a second switch 102 coupled between the first input node 106a and the negative output node 109−, a third switch 103 coupled between the second input node 106b and the negative output node 109−, and a fourth switch 104 coupled between the second input node 106b and the positive output node 109+. A first negative bootstrapped level shifter 107a and a first positive bootstrapped level shifter 107b are each coupled between the first input node 106a and a first clock signal circuit 110a and configured to provide negative and positive switching signals to the first switch 101 and the second switch 102. A second negative bootstrapped level shifter 108a and a second positive bootstrapped level shifter 108b are each coupled between the second input node 106b and a second clock signal circuit 110b and configured to provide negative and positive switching signals to the third switch 103 and the fourth switch 104.

Figure 2A:
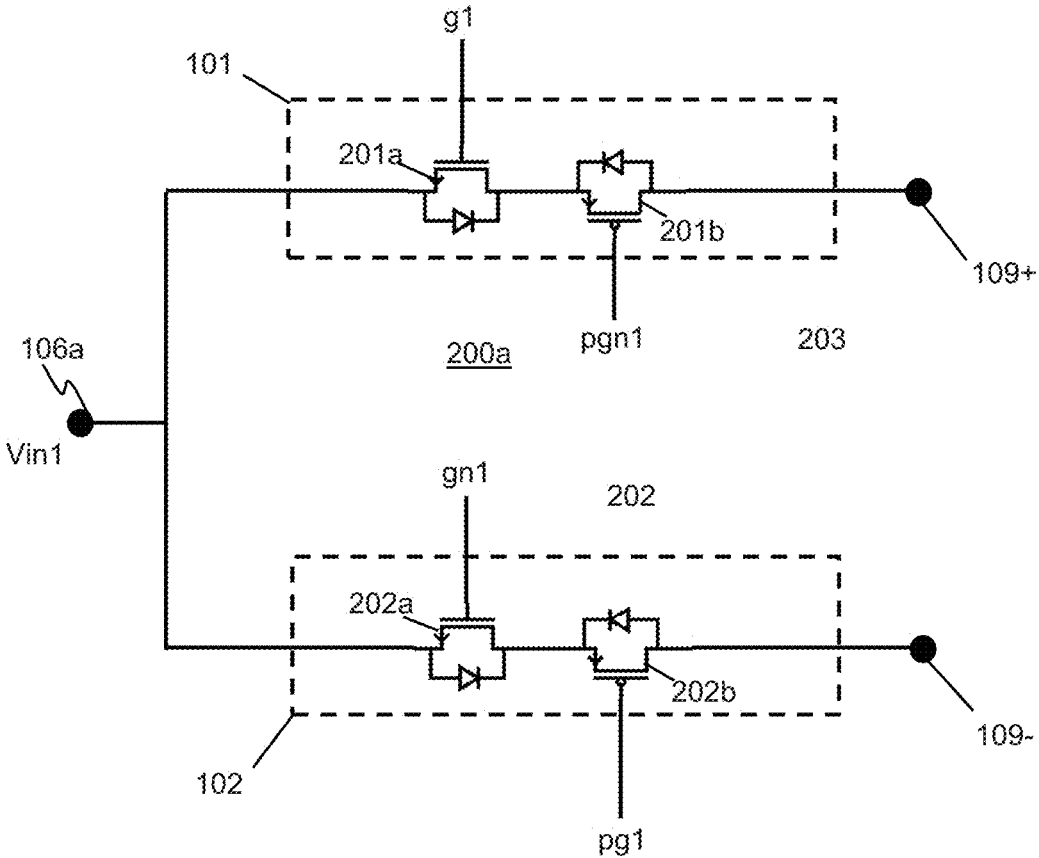
FIG. 2a is a schematic diagram illustrating example first and second switches for a bootstrapped switching circuit.

FIG. 2a illustrates an example circuit 200a comprising the first and second switches 101, 102. Each switch 101, 102 comprises a first MOSFET 201a, 202a with its source coupled to the input node 106a and a second MOSFET 201b, 202b connected in series with the first MOSFET 201a, 202a. A body diode is indicated as part of each MOSFET, which is intrinsic to each device. A drain of the first MOSFET 201a, 202a of each switch 101, 102 is connected to a source of the second MOSFET 201b, 202b. A drain of the second MOSFET 201b in the first switch 101 is connected to the positive output node 109+ and a drain of the second MOSFET 202b in the second switch 102 is connected to the negative output node 109−. The first and second MOSFETs 201a, 201b, 202a, 202b in each switch 101, 102 are of an opposite type, with the first MOSFET 201a, 202a being an N-channel MOSFET and the second MOSFET 201b, 202b a P-channel MOSFET.

As described in further detail below, gate signals g1, gn1, pg1, pgn1 are provided to gates of the first and second MOSFETs 201a, 201b, 202a, 202b of the first and second switches 101, 102 by the first negative bootstrapped level shifter 107a and first positive bootstrapped level shifter 107b.

Figure 2B:
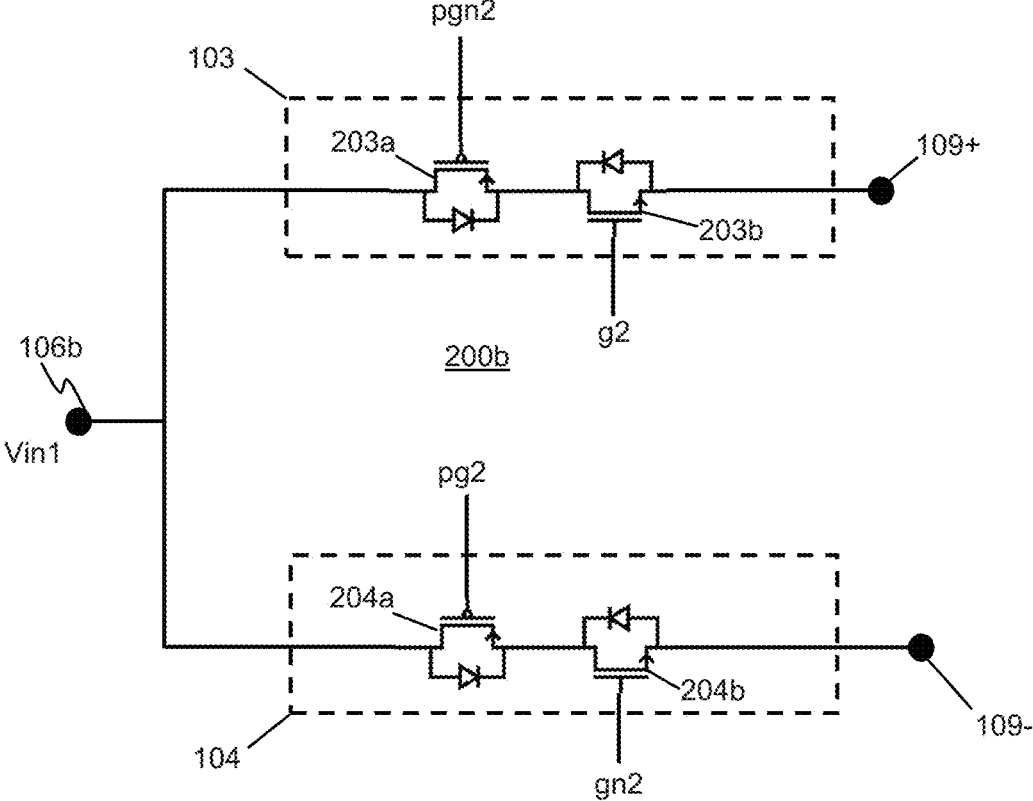
FIG. 2b is a schematic diagram illustrating example third and fourth switches for a bootstrapped switching circuit.

FIG. 2b illustrates an example circuit 200b comprising the third and fourth switches 103, 104. As with the first and second switches 101, 202, each switch 103, 104 comprises a first MOSFET 203a, 204a and a second MOSFET 203b, 204b of an opposite type in a series connected arrangement. In the third and fourth switches 103, 104, however, the first MOSFET 203a, 204a in each switch 103, 104 is a P-channel MOSFET and the second MOSFET 203b, 204b is an N-channel MOSFET. This difference in topology allows for the dynamic range of the input signal, i.e. the battery cell voltage, to be increased while staying within the safe operating area (SOA) of the MOSFETs in the switches 103, 104.

A drain of the first MOSFET 203a, 204a in each of the third and fourth switches 103, 104 is connected to the input node 106a. A source of the first MOSFET 203a, 204a of each of the third and fourth switches 103, 104 is connected to a drain of the second MOSFET 203b, 204b of each of the third and fourth switches 103, 104. A source of the second MOSFET 203b in the third switch 103 is connected to the positive output node 109+ and a source of the second MOSFET 204b in the fourth switch 104 is connected to the negative output node 109−.

As described in further detail below, gate signals g2, gn2, pg2, pgn2 are provided to gates of the first and second MOSFETs 203a, 203b, 204a, 204b of the third and fourth switches 103, 104 by the second negative bootstrapped level shifter 108a and second positive bootstrapped level shifter 108b.

Figure 3:
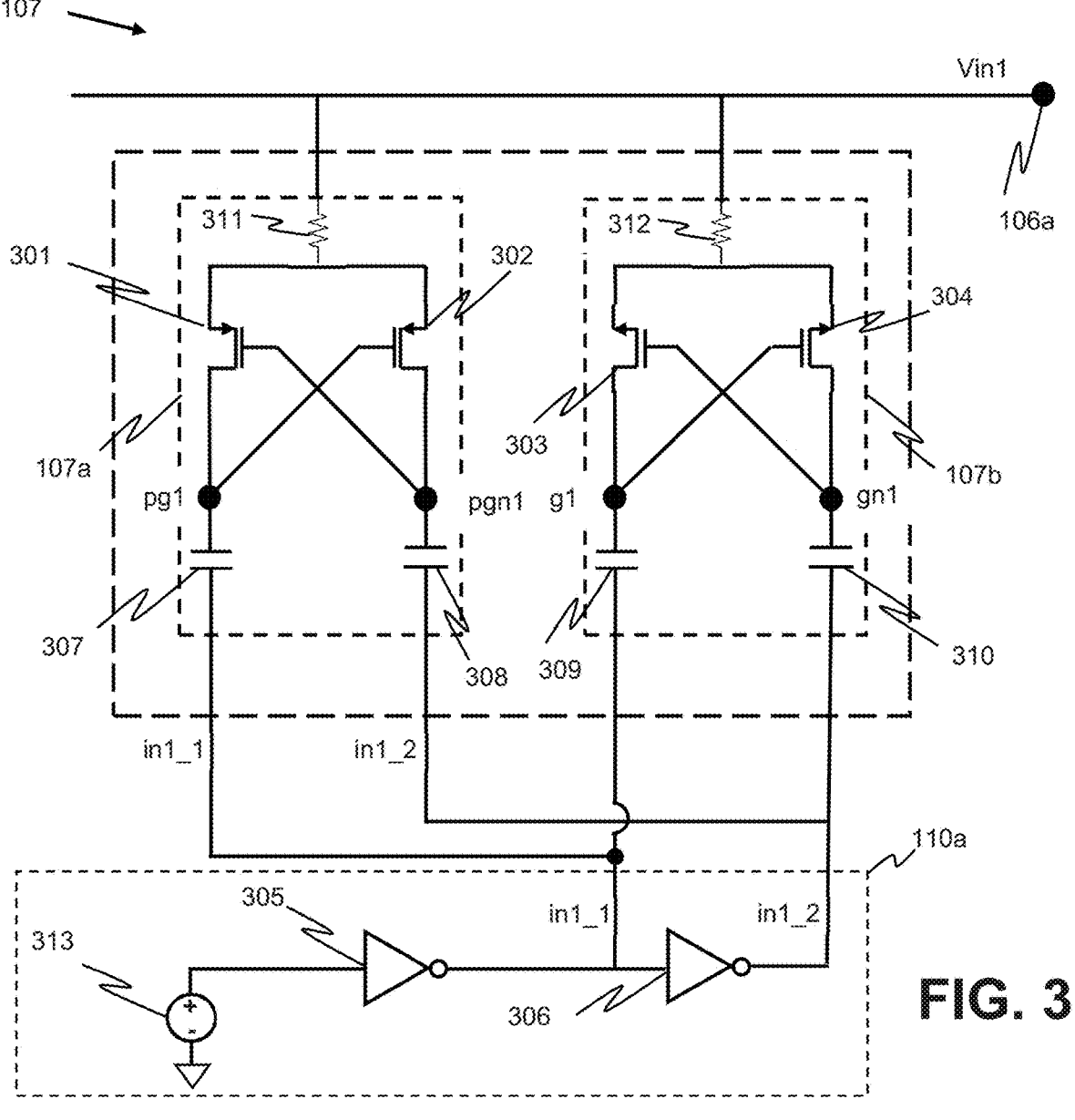
FIG. 3 is a schematic diagram of a dual bootstrapped level shifter.

FIG. 3 illustrates an example configuration of the first negative and positive bootstrapped level shifters 107a, 107b of the switching circuit 100 of FIG. 1. The first negative bootstrapped level shifter 107a comprises first and second P-channel MOSFETs 301, 302, first and second level shifter capacitors 307, 308, and a resistor 311 connecting the first negative bootstrapped level shifter 107a to the first input node 106a to protect the MOSFETs 301, 302. The first positive level shifter 107b similarly comprises first and second N-channel MOSFETs 303, 304, first and second level shifter capacitors 309, 310, and a resistor 312 connecting the first positive level shifter 107b to the first input node 106a to protect the MOSFETs 303, 304. The resistors 311, 312 are provided as part of a simulated circuit to represent connection resistances and may not be required as separate components in an implementation.

In a general aspect, each level shifter comprises a first level shifter MOSFET 301, 303, a second level shifter MOSFET 302, 304, a first level shifter capacitor 307, 309 coupled between the clock signal circuit 110a, the drain of the first level shifter MOSFET 301, 303 and the gate of the second level shifter MOSFET 302, 304, a second level shifter capacitor 308, 310 coupled between the clock signal circuit 110a, the drain of the second level shifter MOSFET 302, 304 and the gate of the first level shifter MOSFET 301, 303. The sources of the first and second level shifter MOSFETs are connected to a respective input node 106a, 106b.

The only high voltage rated components required in the switching circuit 100 are the capacitors 307-310, which must have a rating high enough to deal with the battery voltage. One side of the capacitors 307-310 are subject to a voltage close to input Vin1, which may be close to 100V, while the other side is connected to a clock signal circuit 110*a*, outputs from which may switch between 0V and 5V. Inputs to the level shifters 107*a*, 107*b* are determined by the clock signal circuit 110*a*. Each level shifter receives first and second inputs in1_1, in1_2 from the clock signal circuit 110*a* derived from a clock signal source 313. In a first mode, the clock signal may be equal to a logic low state (i.e. 0V), therefore in1_1 is in a logic high state, and in1_2 is in a logic low state due to placement of inverters 305, 306. In a second mode, the clock signal may be equal to a logic high state (e.g. 5V), and in1_1 assumes logic low, and in1_2 logic high.

The bootstrapped level shifters 107*a*, 107*b* are connected to the first input node 106*a* to receive the first input voltage Vin1 and the switching signals in1_1, in1_2. The first negative bootstrapped level shifter 107*a* is configured to produce negative shifted voltages pg1, pgn1 with respect to Vin1, such that, as Vin1 changes, the voltages V(pgn1) and V(pg1) stay X volts below Vin1, i.e.:

$$V(pgn1) = V(Vin1) - X$$

$$V(pg1) = V(Vin1) - X$$

The signals pgn1 and pg1 are used to drive the gates of the P-channel MOSFETS 201*b*, 202*b* of the first switch 101 and the second switch 102 respectively in different modes of operation.

The first positive bootstrapped level shifter 107*b* is configured to provide positive shifted voltages g1, gn1 with respect to Vin1, i.e.:

$$V(g1) = V(Vin1) + X$$

$$V(gn1) = V(Vin1) + X$$

The signals g1 and gn1 are used to drive the gate of N-channel MOSFETs 201*a*, 202*a* of the first switch 101 and the second switch 102 respectively in different modes of operation.

In the case where the switches are of the configuration illustrated in FIG. 2*a*, negative shifted voltages pgn1, pg1 drive the gates of the P-channel MOSFETs 201*b*, 202*b* in the first and second switches respectively, and positive shifted voltages g1, gn1 drive the gates of the first MOSFETs 201*a*,202*a* of the first and second switches respectively.

Figure 4:
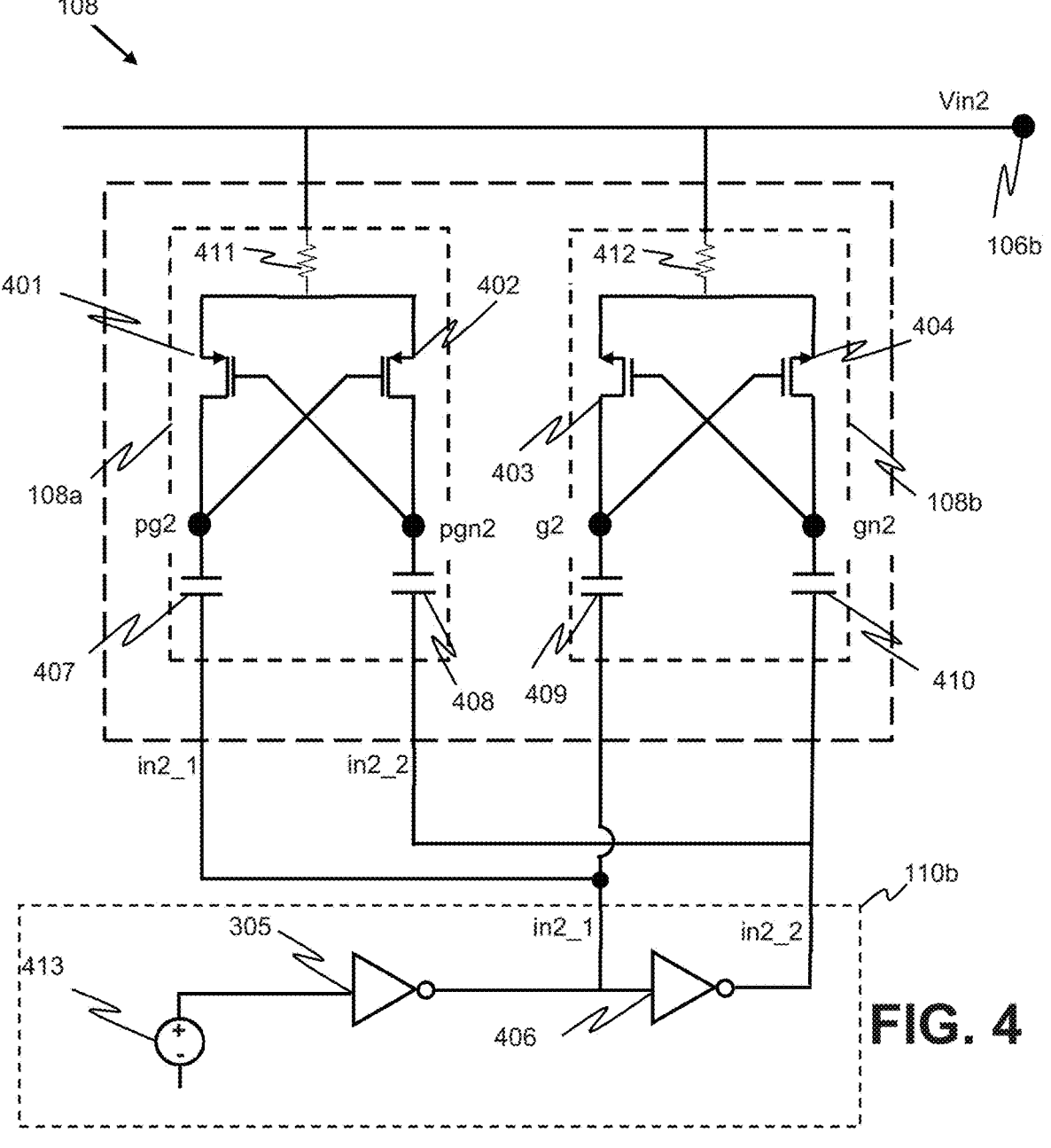
FIG. 4 is a schematic diagram of a dual bootstrapped level shifter.

FIG. 4 illustrates an example configuration of the second positive and negative bootstrapped level shifters 108*a*, 108*b* in the switching circuit 100. The bootstrapped level shifters 108*a*, 108*b* have an identical configuration to the level shifters 107*a*, 107*b* as illustrated in FIG. 3, in which shifted voltages are now with respect to the second input voltage Vin2 and used to drive the MOSFETs in the third and fourth switches 103, 104. The second negative bootstrapped level shifter 108*a* provides negative shifted voltages pgn2, pg2 with respect to the input voltage Vin2 to drive the gates of P-channel MOSFETs 203*a*, 204*a* of the third and fourth switches 103, 104 respectively in different modes of operation, where:

$$V(pgn2) = V(Vin2) - X$$

$$V(pg2) = V(Vin2) - X$$

The second positive bootstrapped level shifter 108*b* provides positive shifted voltages g2, gn2 with respect to the input voltage Vin2 to drive the gates of N-channel MOS-FETs 203*b*, 204*b* of the third and fourth switches 103, 104 respectively in different modes of operation, where:

$$V(g2) = V(Vin2) + X$$

$$V(gn2) = V(Vin2) + X$$

In a general aspect, negative level shifters 107*a*, 108*a* are used to drive P-channel MOSFETs of switches 101-104, and positive level shifters 107*b*, 108*b* are used to drive N-channel MOSFETs of the switches 101-104.

First Mode

Figure 5:
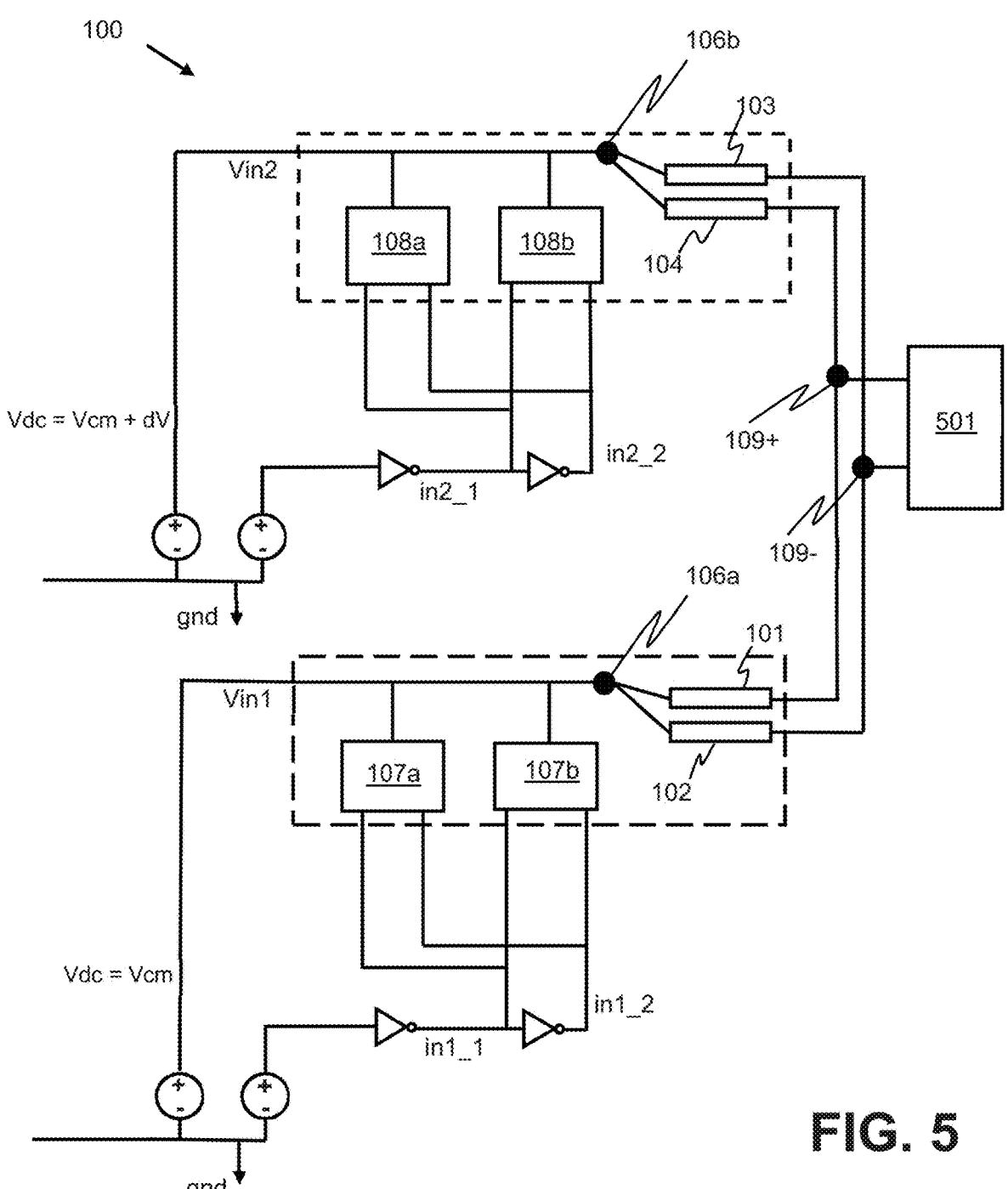
FIG. 5 is a block diagram of a bootstrapped switching circuit.

The circuit 100 illustrated in FIG. 5 is configured to operate in a first mode, where the first and third switches 101, 103 are closed to connect the first input node 106*a* to the positive output node 109+ and the second input node 106*b* to the negative output node 109−, while the second and fourth switches (102, 104) are open.

Considering the switches 101-104 being of the type depicted in FIG. 2*a*, in the first mode inputs in1_1 and in2_1 are set to logic high, and inputs in1_2 and in2_2 are set to logic low.

A voltage level at pgn1 of the first negative bootstrapped level shifter assumes a lower voltage than the voltage level at pg1, resulting in PMOS 301 being driven in an ON state, and PMOS 302 in an OFF state. The voltage level at pgn1 drives the gate of the PMOS 201*b* of the first switch 101. A voltage level at g1 of the first positive bootstrapped level shifter assumes a higher voltage than the voltage level at gn1, resulting in NMOS 304 being driven in an ON state, and NMOS 303 in an OFF state. The voltage level at g1 drives the gate of the NMOS 201*a* of the first switch 101. This first mode of operation connects the first input voltage Vin1 to the positive output node 109+ via the first switch 101.

A voltage level at pgn2 of the second negative bootstrapped level shifter assumes a lower voltage than the voltage level at pg2, resulting in PMOS 401 being driven in an ON state, and PMOS 402 in an OFF state. The voltage level at pgn2 drives the gate of the PMOS 203*a* in the third switch 103. A voltage level at g2 of the second positive bootstrapped level shifter assumes a higher voltage than the voltage level at gn2, resulting in NMOS 404 being driven in an ON state and NMOS 403 in an OFF state. The voltage level at g2 drives the gate of the NMOS 203*b* of the third switch 103. This first mode of operation connects the second input voltage Vin2 to the negative output node 109− via the third switch 103.

Second Mode

The circuit is also configured to operate in a second mode, where the second and fourth switches 102, 104 are closed to connect the first input node 106*a* to the negative output node 109− and the second input node 106*b* to the positive output node 109+, while the first and third switches 101, 103 are open.

In the second mode of operation with the switches 101-104 being the type as depicted in FIG. 2a, inputs in1_1 and in2_1 are set to logic low, and in1_2 and in2_2 are set to logic high.

A voltage level at pg1 of the first negative bootstrapped level shifter now assumes a lower voltage than the voltage level at pgn1, resulting in PMOS 302 being driven in an ON state and PMOS 301 in an OFF state. The voltage level at pg1 drives the gate of the PMOS 202b of the second switch 102. The voltage level at gn1 of the first positive bootstrapped level shifter now assumes a higher level than the voltage level at g1, and NMOS 303 is now driven in an ON state, and NMOS 304 is in an OFF state. The voltage level at gn1 now drives the gate of the NMOS transistor 202a of the second switch 102. This second mode of operation connects the first input voltage Vin1 to the negative output node 109– via the second switch 102.

The voltage level at pg2 of the second negative bootstrapped level shifter now assumes a lower voltage than the voltage level at pgn2, resulting in PMOS 402 being driven in an ON state and PMOS 401 in an OFF state. The voltage level at pg2 drives the gate of the PMOS 204a of the fourth switch 104. The voltage level at gn2 of the second positive bootstrapped level shifter now assumes a higher level than the voltage level at g2, and NMOS 403 is driven in an ON state, and NMOS 404 is in an OFF state. The voltage level at gn2 now drives the gate of the NMOS transistors 204b of the fourth switch 104. This second mode of operation connects the second input voltage Vin2 to the positive output node 109+ via the fourth switch 104.

An advantage of this configuration of switches is that the previous requirement of knowing the lower of the two inputs Vin1 and Vin2 is removed, which in turn reduces the size of the circuit and the number of high voltage components required.

When operating in the first mode, the first 101 and third 103 switches connect Vin1 and Vin2 to the positive 109+ and negative 109– output nodes respectively, while also connecting Vin1 to the output side of the fourth switch, and Vin2 to the output side of the second switch, which may lead to leakage in conventional topologies. The switch of opposite type in the circuits described herein avoids turning on the other MOSFET within each switch in reverse, thereby preventing leakage while handling bipolar input signals.

Output nodes 109+ and 109– can be processed by other circuitry 501 (such as a measurement module 1202, described below in relation to FIG. 12) in order to measure the differential voltage across the inputs Vin1 and Vin2.

Figure 6:
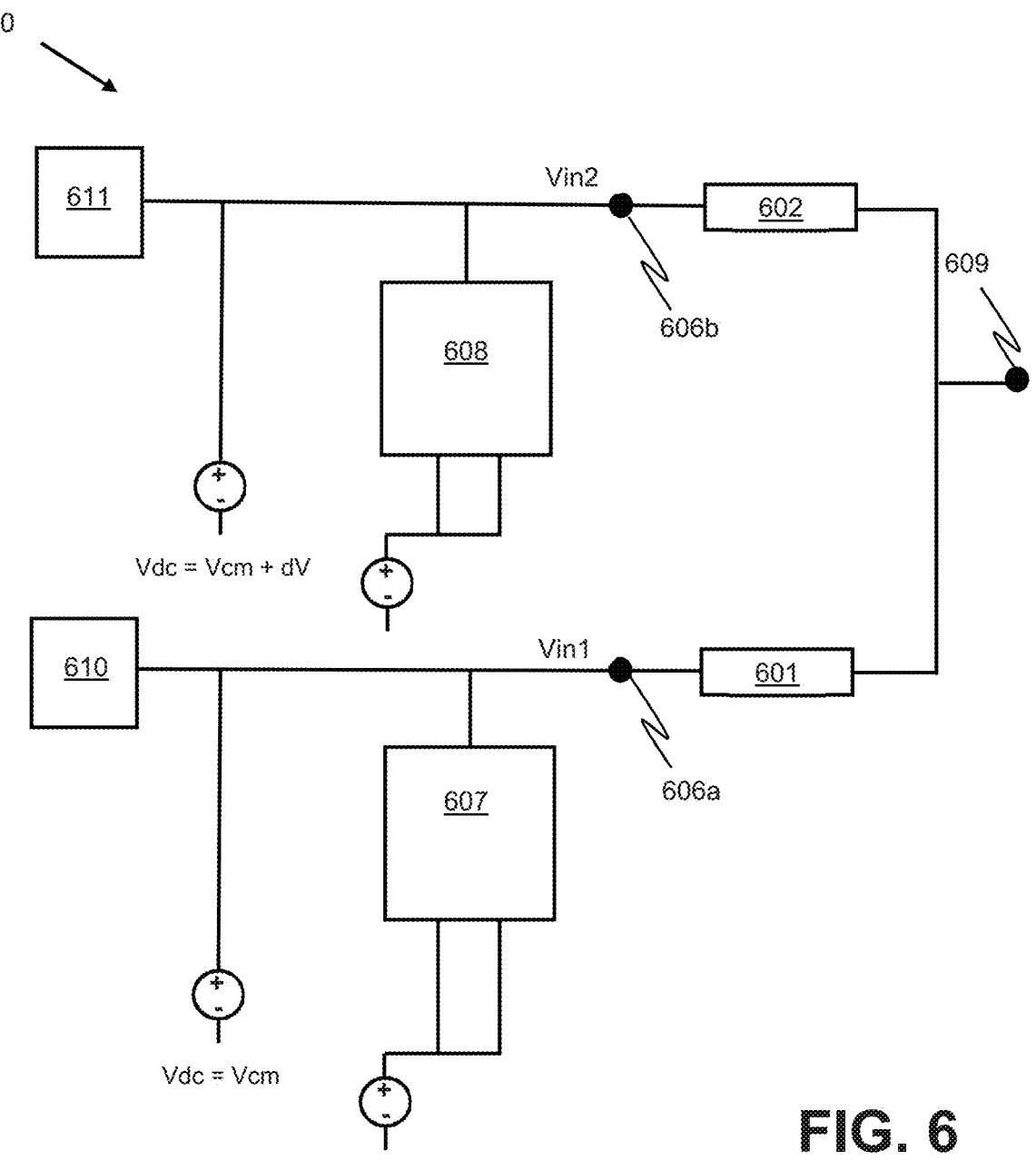
FIG. 6 is a block diagram of a bootstrapped switching circuit with intermediate tank capacitors.
Figure 7:
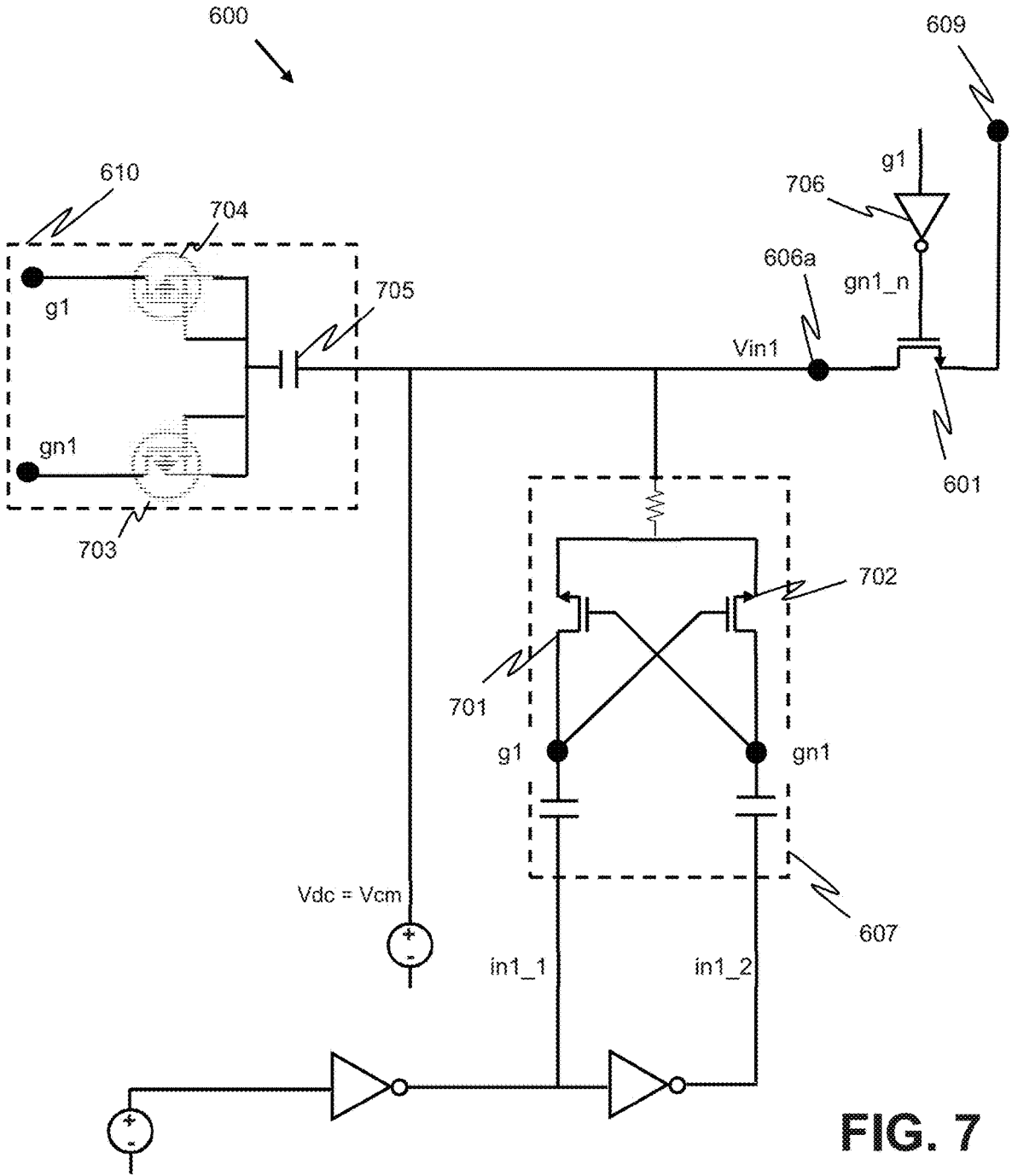
FIG. 7 is a schematic diagram of an intermediate tank capacitor.

FIG. 6 illustrates an example bootstrapped switching circuit similar to that disclosed in U.S. Pat. No. 8,963,630B2 combined with additional components serving as intermediate tank capacitor circuits 610, 611. The addition of a tank capacitor circuit reduces the size requirement of the capacitors within the level shifter 607, reducing the overall size of the bootstrapped switching circuit 600. FIG. 7 illustrates part of the example switching circuit 600 of FIG. 6 comprising a positive bootstrapped level shifter 607, a single NMOS switch 601, with a tank capacitor circuit 610 connected to the input node 606a, which is configured to receive a first input voltage Vin1. The tank capacitor circuit 610 comprises a tank capacitor 705, and two MOSFETs of opposite type to those in the level shifter 607, which in the case for a positive bootstrapped level shifter are P-channel. The MOSFETs 703, 704 are connected to act as diodes. The tank capacitor 705 is connected to the source and gate of the tank capacitor circuit MOSFETs 703, 704. The drains of the tank capacitor circuit MOSFETs are connected to the level shifter capacitors.

As circuit requirements change, the size of the MOSFET 601 may increase, requiring larger high voltage capacitors in the level shifter 607. It may be advantageous to add an inverter 706 to drive the MOSFET 601. The power for the inverter 706 can be derived from the voltage developed across the capacitor 705.

The tank capacitor 705 has a lower voltage requirement than those of the level shifter 607, so can be made smaller, enabling a higher circuit density.

The circuit should not be limited to the illustrated example alone but may instead comprise a PMOS switch with a negative bootstrapped level shifter and a tank capacitor circuit comprising N-channel MOSFETs. Additional tank capacitor circuit 611 in FIG. 6 follows an identical connection to the level shifter 608 and the second input node 606b.

Figure 8:
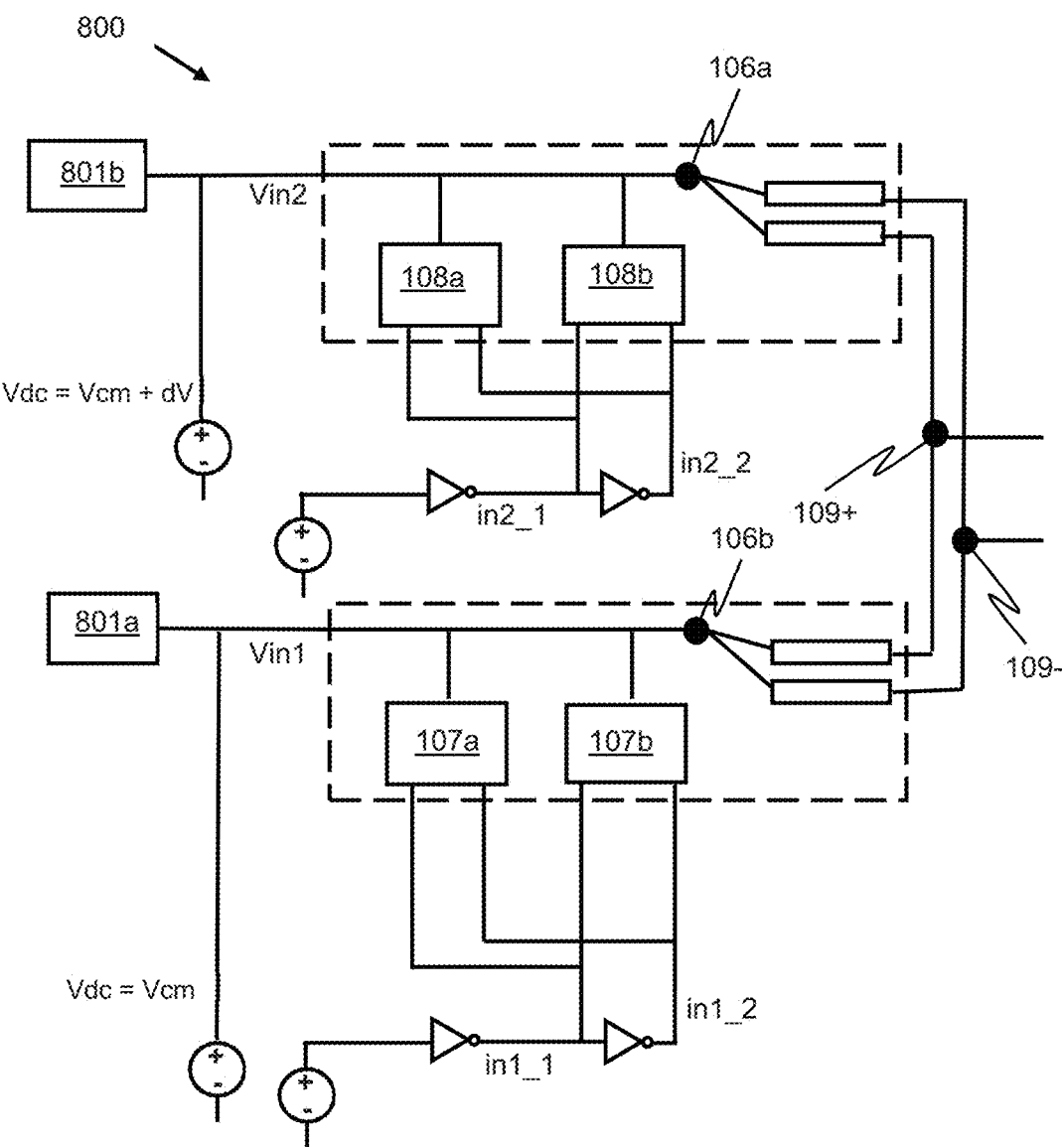
FIG. 8 is a block diagram of a bootstrapped switching circuit with intermediate tank capacitors.

FIG. 8 illustrates the concept of the addition of tank capacitor circuits to the bootstrapped switching circuit 100. The switching circuit 800 further comprises a first tank capacitor circuit 801a and a second tank capacitor circuit 801b, details of which are further illustrated in FIGS. 9 and 10. Each tank capacitor circuit 801a, 801b comprises a first, second, third and fourth tank MOSFETs 901-904, 1001-1004 and first and second tank capacitors 905a, 905b, 1005a, 1005b. The first and second MOSFETs 901, 902, 1001, 1002 are p-channel MOSFETs, while the third and fourth MOSFETs 903, 904, 1003, 1004 are n-channel MOSFETs. The MOSFETs 901-904, 1001-1004 are arranged and connected to be used as diodes, i.e. with the gate and source (or body) connected together. In the first tank capacitor circuit 801a, the first tank capacitor 905a is connected between the first input node 106a and the gate and source connections of the third and fourth tank MOSFETs 903, 904, and the second tank capacitor 905b is connected between the first input node 106a and the gate and source connections of the first and second tank MOSFETs 901, 902. In the second tank capacitor circuit 801b, the first tank capacitor 1005a is connected between the second input node 106b and the gate and source connections of the third and fourth tank MOSFETs 1003, 1004, and the second tank capacitor 1005b is connected between the second input node 106b and the gate and source connections of the first and second tank MOSFETs 1001, 1002. The drain connections of the first and second tank MOSFETs 901, 902 of the first tank capacitor circuit 801a are connected to the first and second level shifter capacitors 309, 310 of the first positive bootstrapped level shifter 107b (see FIG. 3), and the drain connections of the third and fourth tank MOSFETs 903, 904 of the first tank capacitor circuit 801a are connected to the first and second level shifter capacitors 307, 308 of the first negative bootstrapped level shifter 107a (see FIG. 3). Similarly, the drains of the first and second tank MOSFETs 1001, 1002 of the second tank capacitor circuit 801b are connected to the first and second level shifter capacitors 409, 410 of the second positive bootstrapped level shifter 108b (see FIG. 4), and the drains of the third and fourth tank MOSFETs 1003, 1004 of the second tank capacitor circuit 801b are connected to the first level shifter capacitors 108a of the second negative bootstrapped level shifter 108a (see FIG. 4).

Figure 9:
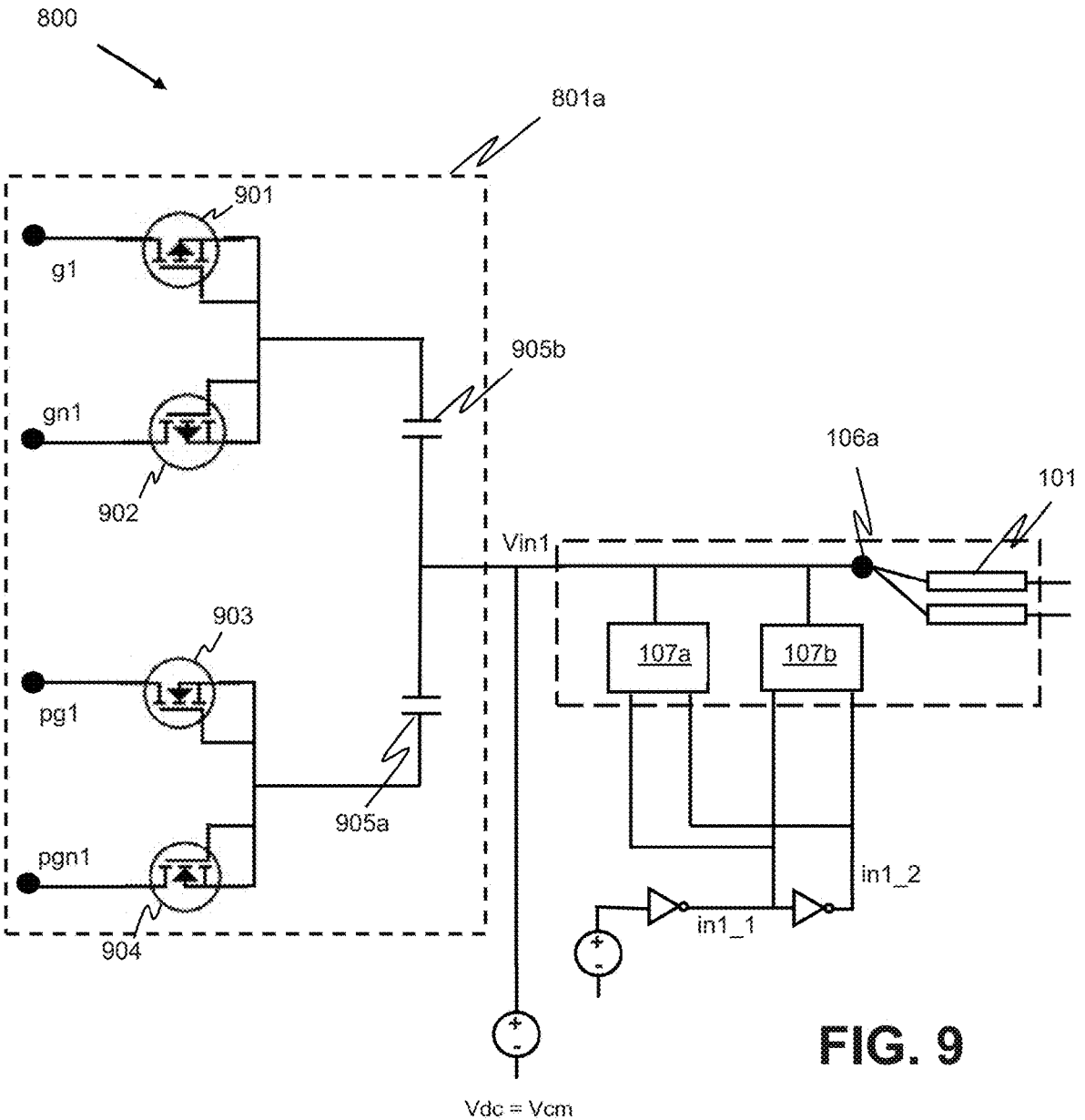
FIG. 9 is a schematic diagram of an intermediate tank capacitor circuit for a bootstrapped switching circuit.
Figure 10:
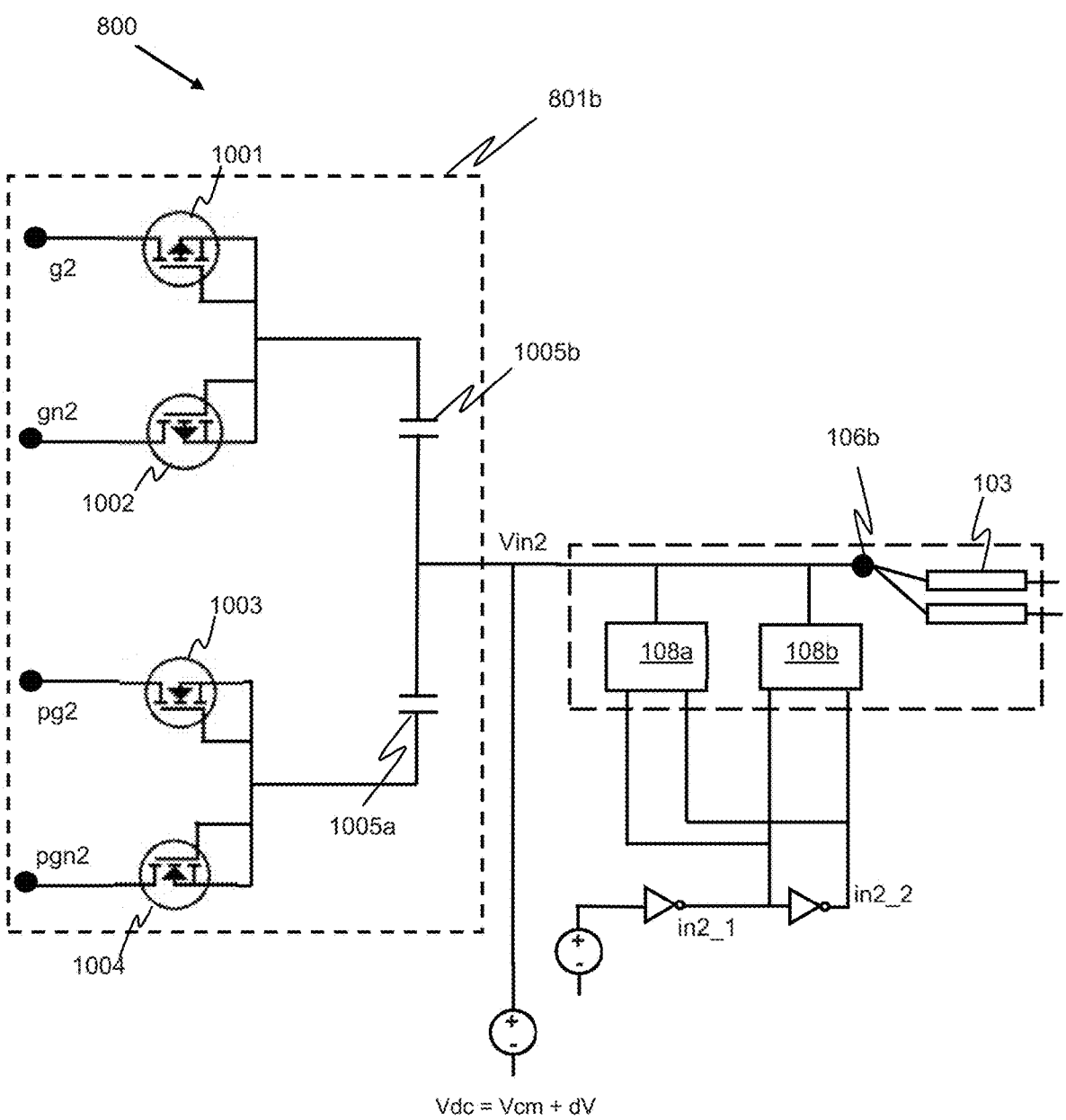
FIG. 10 is a schematic diagram of an intermediate tank capacitor circuit a bootstrapped switching circuit.

The MOSFETs 901-904, 1001-1004 illustrated in FIGS. 9 and 10 are shown as enhancement mode n-channel and p-channel MOSFETs connected as P-N junction diodes. In a general aspect the MOSFETs may be defined as diodes, with the first and second diodes 901, 902, 1001, 1002 in each circuit 801a, 801b having cathode connections connected to the respective capacitor 905b, 1005b and the third and fourth diodes 903, 904, 1003, 1004 having anode connections connected to the respective capacitor 905a, 1005a. Referring to FIG. 9, current flows into the circuit from g1 and gn1 through the first and second diodes 901, 902 to the second capacitor 905b, causing the voltage on capacitor 905b to rise relative to Vin1. For the third and fourth diodes 903, 904, current flows from the node 106b to the first capacitor 905a and flows from the capacitor 905a through the diodes 903, 904 towards pg1 and pgn1. The voltage on capacitor 905a will therefore fall relative to Vin1.

Incorporating tank capacitors into the bootstrapped switching circuit allows a reduction in size of the low-density high voltage capacitors within the positive and negative bootstrapped level shifters, but with the cost of adding smaller area low to medium voltage capacitors. The increase in area required for the circuit component allows for a more efficient time to be achieved when charging the tank capacitors to the voltage sufficient for RDS(on) of the switches 101-104 to drop below an acceptable threshold.

Figure 11:
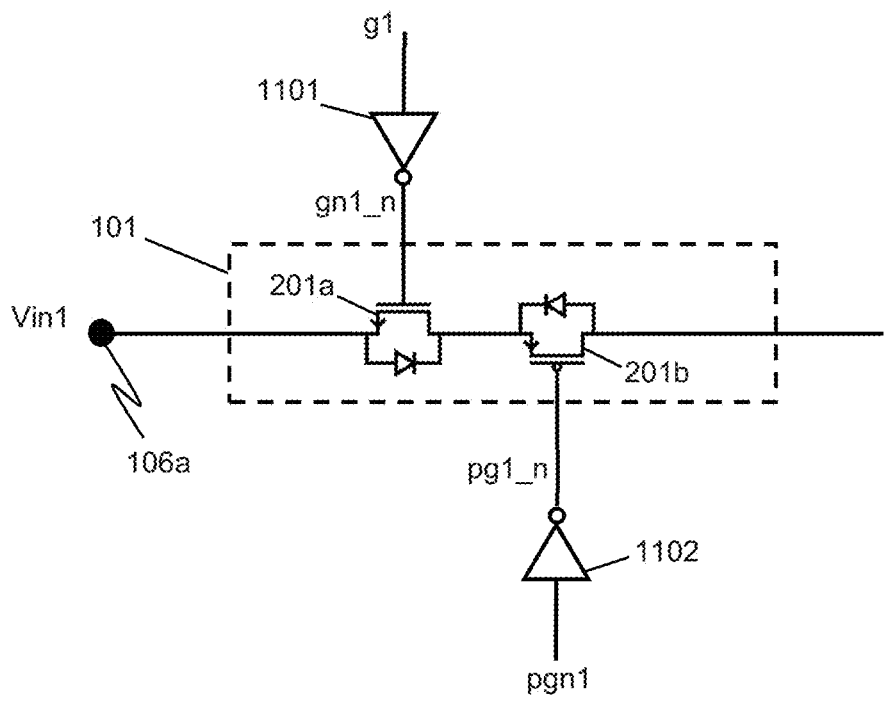
FIG. 11 is a schematic diagram of an example switch for a bootstrapped switching circuit having an intermediate tank capacitor circuit.

An alternative arrangement for the switches 101-104 is illustrated in FIG. 11, in which inverters 1101, 1102 are provided between the switching signal inputs and the gates of the first and second MOSFETs 201a, 201b. Such an arrangement may be used in combination with the tank capacitor circuit examples described above. Voltages built up across the tank capacitors 9051, 905b, 1005a, 1005b is used to power inverters 1101, 1102. When fully charged, the tank capacitors are large enough to deliver or recuperate the necessary charge to switch the inverters and the associated MOSFETs 201,202, 203 in the time required.

The combination of features disclosed, particularly the switch configuration which eliminates leakages through the switches, and the tank capacitors, reduce the size of both the circuit and components of the switching circuit due fewer high voltage components being required.

Figure 12:
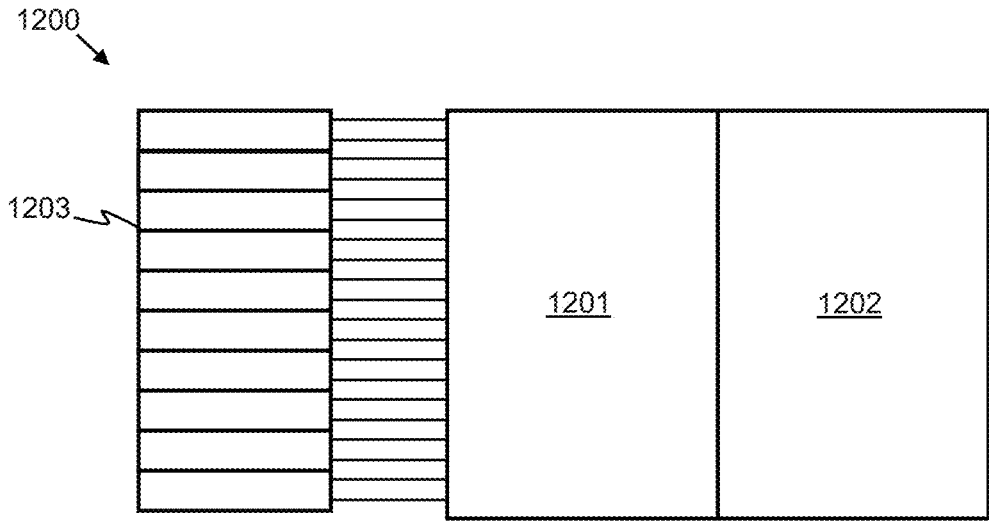
FIG. 12 is a schematic diagram of an example battery management system including a plurality of bootstrapped switching circuits.

FIG. 12 illustrates an example battery management system 1200 comprising an analog front end 1201 and a measurement module 1202. The analog front end 1201 comprises a plurality of switching circuits as described herein, with the first and second input nodes of each switching circuit being connected to respective first and second output connections of each one of a respective plurality of cells of a battery 1203. The measurement module 1202 is connected to sample voltages across the positive and negative output nodes of each switching circuit in the analog front end.

Figure 13:
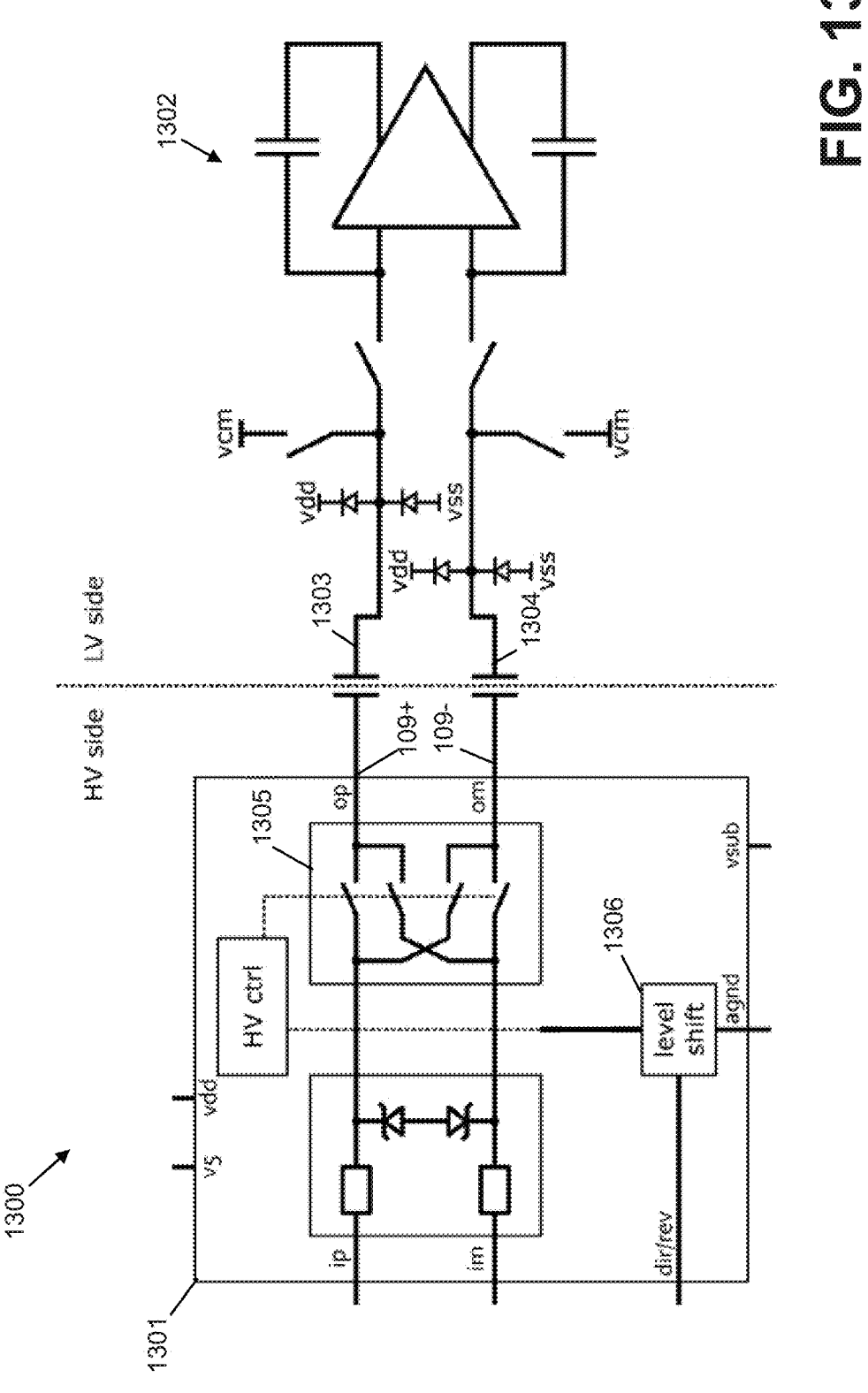
FIG. 13 is a schematic diagram of an example bootstrapped switching circuit connected to an integrator of a delta-sigma modulator for a battery management system.

FIG. 13 illustrates an example circuit 1300 comprising a bootstrapped switching circuit 1301 in combination with a delta-sigma modulator 1302. The bootstrapped switching circuit 1301 is on the high voltage (HV) side of the circuit 1300 and is capacitively coupled to the delta-sigma modulator 1302 on a low voltage (LV) side 1302 of the circuit 1300. The delta-sigma modulator 1302 has first and second input terminals 1303, 1304 connected to the positive and negative output nodes 109+, 109- of the switching circuit 1301. The switching circuit 1301 is similar to that illustrated in FIG. 1 and described above, with the first to fourth switches illustrated as switches 1305, described in more detail below. Control of the switches 1305 is as described above, using the level shifter circuits 1306.

Figure 14:
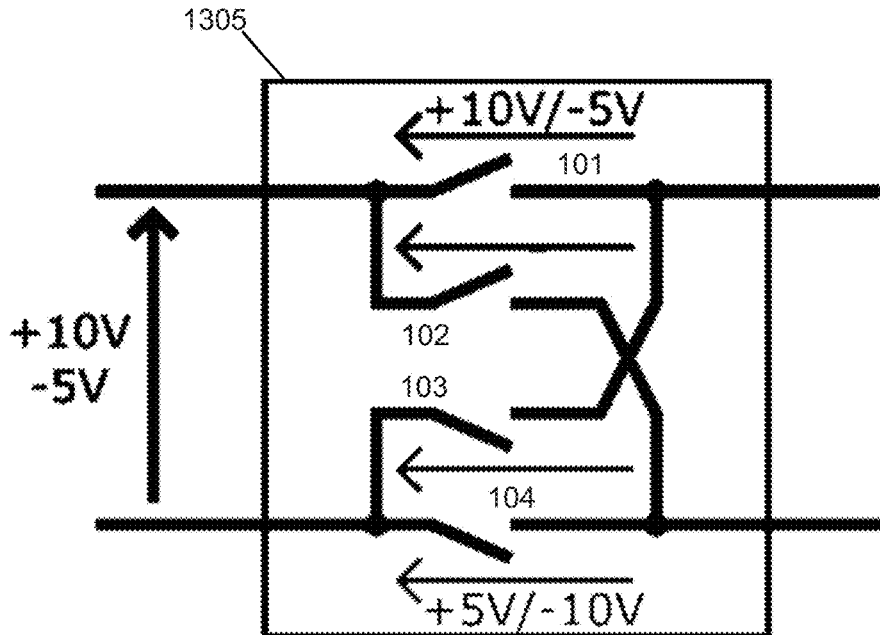
FIG. 14 is a schematic diagram of an arrangement of switches in the bootstrapped switching circuit of FIG. 13.

As illustrated in FIG. 14, the four switches 101-104, being non-symmetrical, limit the maximum voltage according to the maximum permitted by the technology, which in this example is +10V/−5V. Each switch can be subject to either +10V/−5V or +5V/−10V depending on the switching phase, p1 or p2, considered. The switches 101-104 are organized in a simple way that ensures that the gate to source voltage of any of the devices does not see a voltage higher than 5V, while the drain to source voltages are limited to 10V. Each switch will only see voltages up to ±5V or ±10V in the OFF state (i.e. when they are not conducting). In the case where they are turned ON, the voltage across them will by definition be equal (or close) to 0V after a certain settling time. This is the underlying principle of all switched capacitor circuits.

Figures 15A, 15B:
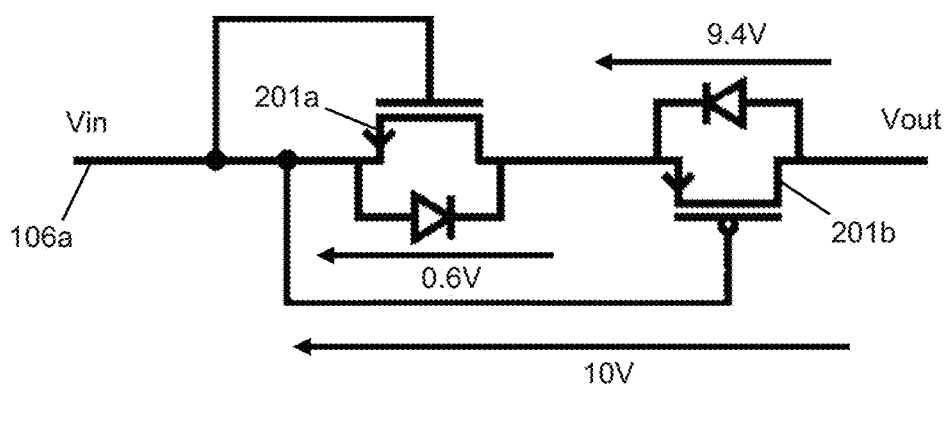
FIGS. 15a and 15b are schematic diagrams of first and second switches of the arrangement of FIG. 14 in OFF mode.

FIGS. 15a and 15b illustrate representations of the first switch 101 in the OFF mode, in which the voltage across the MOSFETs 201a, 201b is either +10V (in FIG. 15a) or −5V (in FIG. 15b). Since the switches 201a, 201b are off, the associated driver circuits will set the gate voltages equal to the input voltage Vin, which is represented by connections between the input 106a and the gates of each MOSFET 201a, 201b. The input voltage Vin may for example vary between around 2V and 90V in a typical application. The second switch 102 operates similarly, as the first and second MOSFETs 202a, 202b operate in the same way.

Figure 16A:
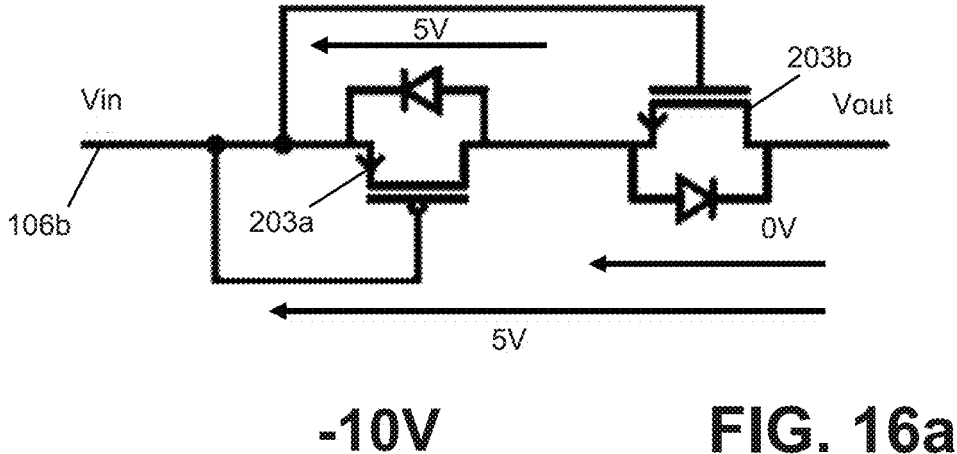
FIGS. 16a and 16b are schematic diagrams of third and fourth switches of the arrangement in FIG. 14 in OFF mode.
Figure 16B:
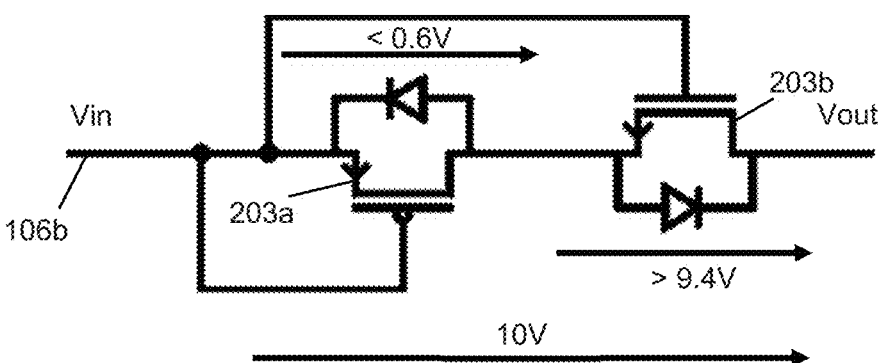

FIGS. 16a and 16b illustrate representations of the third switch 103 in the OFF mode, in which the voltage across the MOSFETs 203a, 203b is either +5V (in FIG. 16a) or −10V (in FIG. 16b). Since the switches 203a, 203b are off, the associated driver circuits will set the gate voltages equal to the input voltage Vin, which is represented by connections between the input 106b and the gates of each MOSFET 203a, 203b. The input voltage Vin may for example vary between around 2V and 90V in a typical application. The fourth switch 104 operates similarly, as the first and second MOSFETs 204a, 204b operate in the same way.

From reading the present disclosure, other variations and modifications will be apparent to the skilled person. Such variations and modifications may involve equivalent and other features which are already known in the art of battery management systems, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A bootstrapped switching circuit comprising:
a positive output node;
a negative output node;
a first input node configured to receive a first input voltage;

a second input node configured to receive a second input voltage;

a first switch coupled between the first input node and the positive output node;

a second switch coupled between the first input node and the negative output node;

a third switch coupled between the second input node and the negative output node;

a fourth switch coupled between the second input node and the positive output node;

a first negative bootstrapped level shifter and a first positive bootstrapped level shifter, each coupled between the first input node and a first clock signal circuit and configured to provide control signals to the first and second switches; and a second negative bootstrapped level shifter and a second positive bootstrapped level shifter, each coupled between the second input node and a second clock signal circuit and configured to provide control signals to the third and fourth switches, wherein each of the first, second, third and fourth switches comprises first and second MOSFETs of an opposite type in a series connected arrangement;

wherein the first MOSFET of the first switch is located on a first input node side of the series coupled arrangement of the first switch;

wherein the first MOSFET of the second switch is located on a first input node side of the series coupled arrangement of the second switch;

wherein the first MOSFET of the third switch is located on a second input node side of the series coupled arrangement of the third switch;

wherein the first MOSFET of the fourth switch is located on a second input node side of the series coupled arrangement of the fourth switch;

wherein the first MOSFET of the first and second switches is of an opposite type to the first MOSFET of the third and fourth switches and the second MOSFET of the first and second switches is of an opposite type to the second MOSFET of the third and fourth switches.

2. The switching circuit of claim 1, wherein the switching circuit is configured to operate in:

a first mode where the first and third switches are closed to connect the first input node to the positive output node and the second input node, to the negative output node, while the second and fourth switches are open; and a second mode where the second and fourth switches are closed to connect the first input node to the negative output node and the second input node to the positive output node, while the first and third switches are open.

3. A bootstrapped switching circuit comprising:

a positive output node;

a negative output node;

a first input node configured to receive a first input voltage;

a second input node configured to receive a second input voltage;

a first switch coupled between the first input node and the positive output node;

a second switch coupled between the first input node and the negative output node;

a third switch coupled between the second input node and the negative output node;

a fourth switch coupled between the second input node and the positive output node;

a first negative bootstrapped level shifter and a first positive bootstrapped level shifter, each coupled between the first input node and a first clock signal circuit and configured to provide control signals to the first and second switches; and a second negative bootstrapped level shifter and a second positive bootstrapped level shifter, each coupled between the second input node and a second clock signal circuit and configured to provide control signals to the third and fourth switches, wherein each of the first, second, third and fourth switches comprises first and second MOSFETs of an opposite type in a series connected arrangement;

wherein each of the bootstrapped level shifters comprise:

a first level shifter MOSFET;

a second level shifter MOSFET;

a first level shifter capacitor connected between a drain of the first level shifter MOSFET and a first output of a respective clock signal circuit, the drain of the first level shifter MOSFET connected to a gate of the second level shifter MOSFET; and a second level shifter capacitor connected between a drain of the second level shifter MOSFET and a second output of a respective clock signal circuit, the drain of the second level shifter MOSFET connected to a gate of the first level shifter MOSFET.

4. The switching circuit of claim 3, wherein the first and second clock signal circuit each comprise:

a clock signal source;

a first inverter connected between the clock signal source and the first output; and a second inverter connected between the first inverter and the second output.

5. The switching circuit of claim 3, wherein the first and second level shifter MOSFETs of the first and second negative bootstrapped level shifters are P-channel MOSFETs and the first and second level shifter MOSFETs of the first and second positive bootstrapped level shifters are N-channel MOSFETs.

6. The switching circuit of claim 3, wherein:

a source of the first MOSFET of the first and second switches is connected to the first input node;

a source of the second MOSFET of the first and second switches is connected to a drain of the first MOSFET of the first and second switches;

a drain of the second MOSFET of the first switch is connected to the positive output node; and a drain of the second MOSFET of the second switch is connected to the negative output node, wherein the first MOSFET of the first and second switches is an n-channel MOSFET and the second MOSFET of the first and second switches is a p-channel MOSFET.

7. The switching circuit of claim 3, wherein:

a drain of the first MOSFET of the third and fourth switches is connected to the second input node;

a drain of the second MOSFET of the third and fourth switches is connected to a source of the first MOSFET of the third and fourth switches;

a source of the second MOSFET of the third switch is connected to the positive output node; and a source of the second MOSFET of the fourth switch is connected to the negative output node, wherein the first MOSFET of the third and fourth switches is a p-channel MOSFET and the second MOSFET of the third and fourth switches is an n-channel MOSFET.

8. The switching circuit of claim 3, wherein:

a gate of the first MOSFETs of the first switch is connected to the drain of the first level shifter MOSFET of the first positive bootstrapped level shifter and a gate of the second MOSFET of the first switch is connected to the drain of the second level shifter MOSFET of the first negative bootstrapped level shifter;

a gate of the first MOSFET of the second switch is connected to the drain of the second level shifter MOSFET of the first positive bootstrapped level shifter and a gate of the second MOSFET of the second switch is connected to the drain of the first level shifter MOSFET of the first negative bootstrapped level shifter;

a gate of the first MOSFET of the third switch is connected to the drain of the first level shifter MOSFET of the second positive bootstrapped level shifter and a gate of the second MOSFET of the third switch is connected to the drain of the second level shifter MOSFET of the second negative bootstrapped level shifter; and a gate of the first MOSFETs of the fourth switch is connected to the drain of the second level shifter MOSFET of the second positive bootstrapped level shifter and a gate of the second MOSFET of the fourth switch is connected to the drain of the first level shifter MOSFET of the second negative bootstrapped level shifter.

9. A bootstrapped switching circuit comprising:

a positive output node;

a negative output node;

a first input node configured to receive a first input voltage;

a second input node configured to receive a second input voltage;

a first switch coupled between the first input node and the positive output node;

a second switch coupled between the first input node and the negative output node;

a third switch coupled between the second input node and the negative output node;

a fourth switch coupled between the second input node and the positive output node;

a first negative bootstrapped level shifter and a first positive bootstrapped level shifter, each coupled between the first input node and a first clock signal circuit and configured to provide control signals to the first and second switches; and a second negative bootstrapped level shifter and a second positive bootstrapped level shifter, each coupled between the second input node and a second clock signal circuit and configured to provide control signals to the third and fourth switches, wherein each of the first, second, third and fourth switches comprises first and second MOSFETs of an opposite type in a series connected arrangement;

a first tank capacitor circuit, the first tank capacitor circuit comprising first, second third and fourth tank diodes and first and second tank capacitors, the first tank capacitor connected between the first input node and a cathode terminal of the third and fourth tank diodes, the second tank capacitor connected between the first input node and an anode terminal of the first and second tank diodes.

10. The switching circuit of claim 9, wherein:

anode terminals of the first and second tank diodes of the first tank capacitor circuit are connected to the first and second level shifter capacitors of the first positive bootstrapped level shifter; and cathode terminals of the third and fourth tank diodes of the first tank capacitor circuit are connected to the first and second level shifter capacitors of the first negative bootstrapped level shifter.

11. The switching circuit of claim 9, wherein the first and second tank diodes of the first tank capacitor circuit are p-channel MOSFETs connected as p-n junction diodes and the third and fourth tank diodes of the first tank capacitor circuit are n-channel MOSFETs connected as p-n junction diodes.

12. The switching circuit of claim 9, further comprising a second tank capacitor circuit, the second tank capacitor circuit comprising first, second, third and fourth tank diodes and first and second tank capacitors, the first tank capacitor connected between the second input node and anode connections of the first and second tank diodes, the second tank capacitor connected between the second input node and cathode connections of the first and second tank diodes, wherein:

anode connections of the first and second tank diodes of the second tank capacitor circuit are connected to the first and second level shifter capacitors of the second positive bootstrapped level shifter; and cathode connections of the third and fourth tank diodes of the second tank capacitor circuit are connected to the first level shifter capacitors of the second negative bootstrapped level shifter.

13. The switching circuit of claim 12, wherein the first and second tank diodes of the second tank capacitor circuit are p-channel MOSFETs connected as p-n junction diodes and the third and fourth tank diodes of the second tank capacitor circuit are n-channel MOSFETs connected as p-n junction diodes.

14. The switching circuit of claim 9, wherein each switch of the switching circuit further comprises:

a first switch inverter connected to the gate of the first MOSFET; and a second switch inverter connected to the gate of the second MOSFET.

15. A battery management system comprising an analog front end and a measurement module, the analog front end comprising a plurality of bootstrapped switching circuits, each of the plurality of bootstrapped switching circuits comprising:

a positive output node;

a negative output node;

a first input node configured to receive a first input voltage;

a second input node configured to receive a second input voltage;

a first switch coupled between the first input node and the positive output node;

a second switch coupled between the first input node and the negative output node;

a third switch coupled between the second input node and the negative output node;

a fourth switch coupled between the second input node and the positive output node;

a first negative bootstrapped level shifter and a first positive bootstrapped level shifter, each coupled between the first input node and a first clock signal circuit and configured to provide control signals to the first and second switches; and a second negative bootstrapped level shifter and a second positive bootstrapped level shifter, each coupled between the second input node and a second clock signal circuit and configured to provide control signals to the third and fourth switches, wherein each of the first, second, third and fourth switches comprises first and second MOSFETs of an opposite type in a series connected arrangement, wherein the first and second input nodes of each switching circuit is connected to respective first and second output connections of each one of a respective plurality of cells of a battery, the measurement module connected to sample voltages across the positive and negative output nodes of each switching circuit in the analog front end;

wherein each of the bootstrapped level shifters in each of the plurality of bootstrapped switching circuits comprise:

a first level shifter MOSFET;

a second level shifter MOSFET;

a first level shifter capacitor connected between a drain of the first level shifter MOSFET and a first output of a respective clock signal circuit, the drain of the first level shifter MOSFET connected to a gate of the second level shifter MOSFET; and a second level shifter capacitor connected between a drain of the second level shifter MOSFET and a second output of a respective clock signal circuit, the drain of the second level shifter MOSFET connected to a gate of the first level shifter MOSFET.

16. The battery management system of claim 15, wherein the first and second clock signal circuits each comprise:

a clock signal source;

a first inverter connected between the clock signal source and the first output; and a second inverter connected between the first inverter and the second output.

17. The battery management system of claim 15, wherein the first and second level shifter MOSFETs of the first and second negative bootstrapped level shifters are P-channel MOSFETs and the first and second level shifter MOSFETs of the first and second positive bootstrapped level shifters are N-channel MOSFETs.

18. The battery management system of claim 15, wherein:

a source of the first MOSFET of the first and second switches is connected to the first input node;

a source of the second MOSFET of the first and second switches is connected to a drain of the first MOSFET of the first and second switches;

a drain of the second MOSFET of the first switch is connected to the positive output node; and a drain of the second MOSFET of the second switch is connected to the negative output node, wherein the first MOSFET of the first and second switches is an n-channel MOSFET and the second MOSFET of the first and second switches is a p-channel MOSFET.

19. The battery management system of claim 15, wherein:

a drain of the first MOSFET of the third and fourth switches is connected to the second input node;

a drain of the second MOSFET of the third and fourth switches is connected to a source of the first MOSFET of the third and fourth switches;

a source of the second MOSFET of the third switch is connected to the positive output node; and a source of the second MOSFET of the fourth switch is connected to the negative output node, wherein the first MOSFET of the third and fourth switches is a p-channel MOSFET and the second MOSFET of the third and fourth switches is an n-channel MOSFET.

* * * * *